(12) United States Patent
Asbeck (10) Patent No.: US 10,392,725 B2
(45) Date of Patent: Aug. 27, 2019

(54) METHOD FOR DEPOSITING SILICON FEEDSTOCK MATERIAL, SILICON WAFER, SOLAR CELL AND PV MODULE

(71) Applicant: Frank Asbeck, Bonn (DE)

(72) Inventor: Frank Asbeck, Bonn (DE)

(73) Assignee: Frank Asbeck, Bonn (DE)

( * ) Notice: Subject to any disclaimer, the term of this patent is extended or adjusted under 35 U.S.C. 154(b) by 0 days.

(21) Appl. No.: 15/708,227

(22) Filed: Sep. 19, 2017

(65) Prior Publication Data
US 2019/0085481 A1    Mar. 21, 2019

(51) Int. Cl.
| | |
|---|---|
| *H01L 21/02* | (2006.01) |
| *H01L 31/0288* | (2006.01) |
| *H01L 31/05* | (2014.01) |
| *H01L 31/068* | (2012.01) |
| *H01L 31/18* | (2006.01) |
| *C30B 35/00* | (2006.01) |
| *C30B 11/02* | (2006.01) |
| *C30B 15/00* | (2006.01) |
| *C30B 29/06* | (2006.01) |

(52) U.S. Cl.
CPC ............ *C30B 35/007* (2013.01); *C30B 11/02* (2013.01); *C30B 15/00* (2013.01); *C30B 29/06* (2013.01); *H01L 21/02576* (2013.01); *H01L 31/0288* (2013.01); *H01L 31/05* (2013.01); *H01L 31/068* (2013.01); *H01L 31/1804* (2013.01); *H01L 21/0262* (2013.01); *H01L 21/02532* (2013.01); *H01L 21/02579* (2013.01)

(58) Field of Classification Search
None
See application file for complete search history.

(56) References Cited

U.S. PATENT DOCUMENTS

| | | | |
|---|---|---|---|
| 2006/0166414 A1* | 7/2006 | Carlson | H01L 21/02381 438/149 |
| 2009/0093094 A1* | 4/2009 | Ye | 438/197 |
| 2009/0102019 A1* | 4/2009 | Haight | B82Y 10/00 257/607 |
| 2017/0260628 A1* | 9/2017 | Fujikura | C30B 25/14 |

FOREIGN PATENT DOCUMENTS

DE    10 2007 041 803 A1    3/2009

\* cited by examiner

*Primary Examiner* — Bo B Jang
(74) *Attorney, Agent, or Firm* — Viering, Jentschura & Partner MBB (57) ABSTRACT

A method for depositing silicon feedstock material may include introducing a first gas including silicon into a reactor chamber and introducing a second gas including at least one of gallium or indium into the reactor chamber and depositing silicon doped with at least one of gallium or indium onto a surface within the reactor chamber. Doped silicon feedstock material may be obtained by the method may be used for obtaining a silicon wafer, a solar cell, and/or a PV module.

14 Claims, 7 Drawing Sheets

METHOD FOR DEPOSITING SILICON FEEDSTOCK MATERIAL, SILICON WAFER, SOLAR CELL AND PV MODULE

TECHNICAL FIELD

Various embodiments relate generally to a method for producing silicon feedstock material, a silicon wafer obtained by a method and a PV module obtained by a method.

BACKGROUND

Silicon feedstock material, e.g. doped silicon, is used in photovoltaics for producing solar cells. Most of the silicon feedstock material is doped with boron. However, boron may form together with oxygen a boron-oxygen complex, which may decrease the performance of a solar cell.

A common method for producing doped silicon feedstock material is to add a dopant to molten silicon in a crucible. Possible problems of such methods arise in the margin of error in controlling the quantity of the dopant and thus in the concentration of the dopant in the doped silicon and the distribution of the dopant in the doped silicon.

SUMMARY

According to an embodiment, a method for depositing doped silicon feedstock material includes introducing a first gas including silicon into a reactor chamber and introducing a second gas comprising at least one of gallium or indium into the reactor chamber. The method further includes depositing silicon doped with at least one of gallium or indium onto a surface within the reactor chamber.

According to an embodiment, doped silicon feedstock material may be obtained by a method comprising introducing a first gas including silicon into a reactor chamber and introducing a second gas including at least one of gallium or indium into the reactor chamber and depositing silicon feedstock material doped with at least one of gallium or indium onto a surface within the reactor chamber.

According to an embodiment, a silicon wafer may be obtained by a method including producing silicon feedstock material doped with at least one of gallium or indium. The method may include introducing a first gas comprising silicon into a reactor chamber and introducing a second gas including at least one of gallium or indium into the reactor chamber and depositing silicon feedstock material doped with at least one of gallium or indium onto a surface within the reactor chamber. Furthermore the method may include at least partially melting the silicon feedstock material doped with at least one of gallium or indium, lowering a temperature of the doped silicon melt to crystallize the doped silicon into a solid silicon ingot and cutting the solid silicon ingot into one or more wafers.

According to an embodiment, a solar cell may be obtained by a method including producing silicon feedstock material doped with at least one of gallium or indium. The method may include introducing a first gas comprising silicon into a reactor chamber and introducing a second gas including at least one of gallium or indium into the reactor chamber and depositing silicon feedstock material doped with at least one of gallium or indium onto a surface within the reactor chamber. Furthermore, the method may include at least partially melting the silicon feedstock material doped with at least one of gallium or indium, lowering a temperature of the doped silicon melt to crystallize the doped silicon into a solid silicon ingot and cutting the solid silicon ingot into one or more wafers. The method may further include forming an emitter on and/or in the one or more wafers.

According to an embodiment, a photovoltaic module (PV module) may be obtained by a method including producing silicon feedstock material doped with at least one of gallium or indium. The method may include introducing a first gas including silicon into a reactor chamber and introducing a second gas including at least one of gallium or indium into the reactor chamber and depositing silicon feedstock material doped with at least one of gallium or indium onto a surface within the reactor chamber. The method may further include at least partially melting the silicon feedstock material doped with at least one of gallium or indium, lowering a temperature of the doped silicon melt to crystallize the doped silicon into a solid silicon ingot and cutting the solid silicon ingot into one or more wafers. Furthermore, the method may include forming an emitter on and/or in the one or more wafers to produce one or more solar cells and electrically contacting the one or more solar cells.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

An aspect of this disclosure, e.g. as described in regard of one of the figures, is to produce doped silicon feedstock material with a dopant such as gallium and/or indium, wherein the gallium and/or indium and the silicon are in the production process in a gaseous phase, e.g. each in a chemical compound which allows producing doped silicon from a gaseous phase.

Another aspect of an example and/or embodiment, e.g. as described in regard of one of the figures, is to produce one or more silicon wafers, one or more solar cells and/or one or more PV modules with gallium and/or indium doped silicon feedstock material. The term doped silicon feedstock material may refer to doped silicon as used for producing silicon ingots, wafers, solar cells and PV modules. However, the doped silicon may also be used otherwise, e.g. not as feedstock material. Furthermore, the term silicon feedstock material may be understood as (doped) silicon/raw silicon before melting in contrast to melted silicon, e.g. in the form of a silicon ingot.

Figure 1:
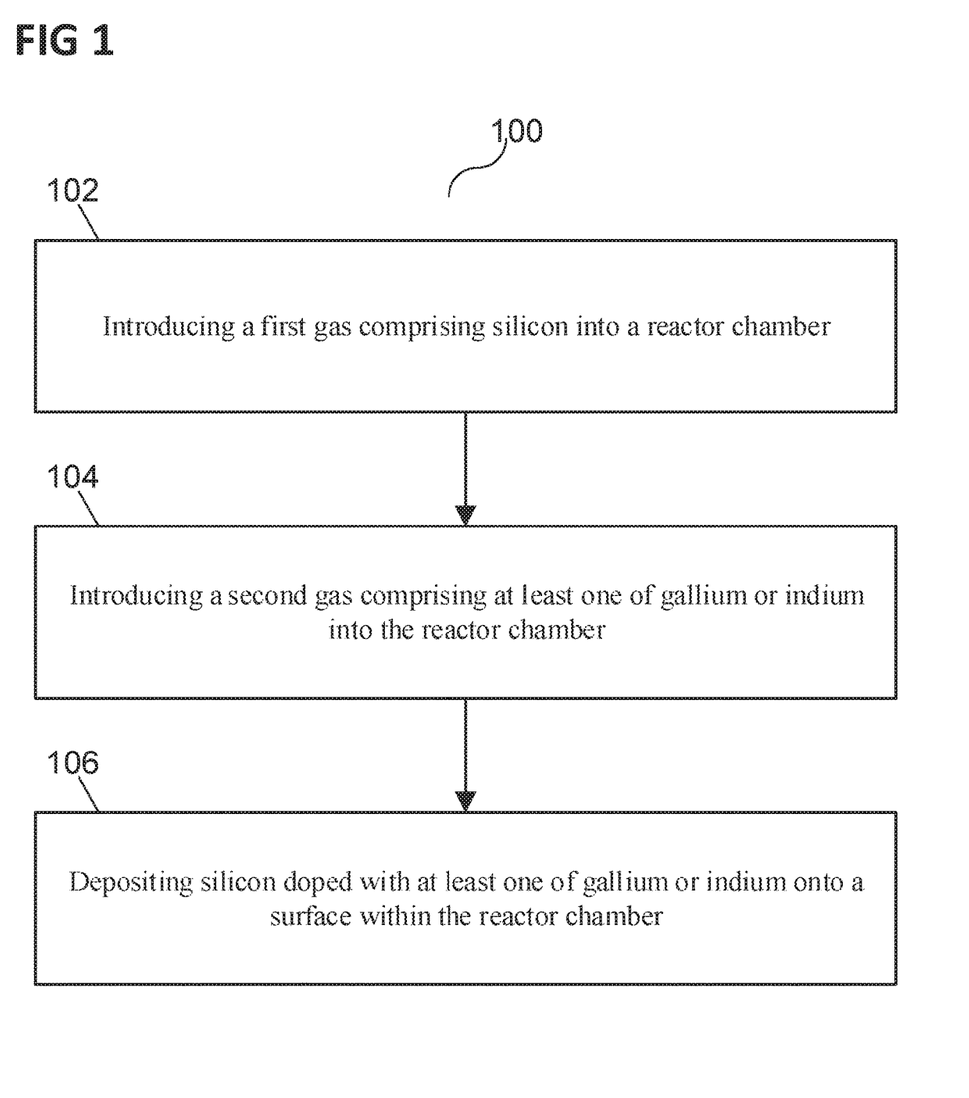
FIG. 1 shows a method for depositing silicon feedstock material.

FIG. 1 schematically shows a method 100 for depositing silicon feedstock material. Method 100 may be used to obtain doped silicon feedstock material.

In 102, the method 100 may include introducing a first gas including silicon into a reactor chamber.

The first gas may include a chemical compound which includes silicon, e.g. trichlorosilane TCS. A chemical compound which includes silicon may be used to keep the silicon in a gaseous phase at process temperatures. The first gas may be a mixture, e.g. the first gas may include hydrogen and/or hydrogen chloride (HCl). To keep the first gas or one of its components in a gaseous phase, the first gas may be kept on an elevated temperature, e.g. above an individual boiling point of one of its components.

Figure 5A:
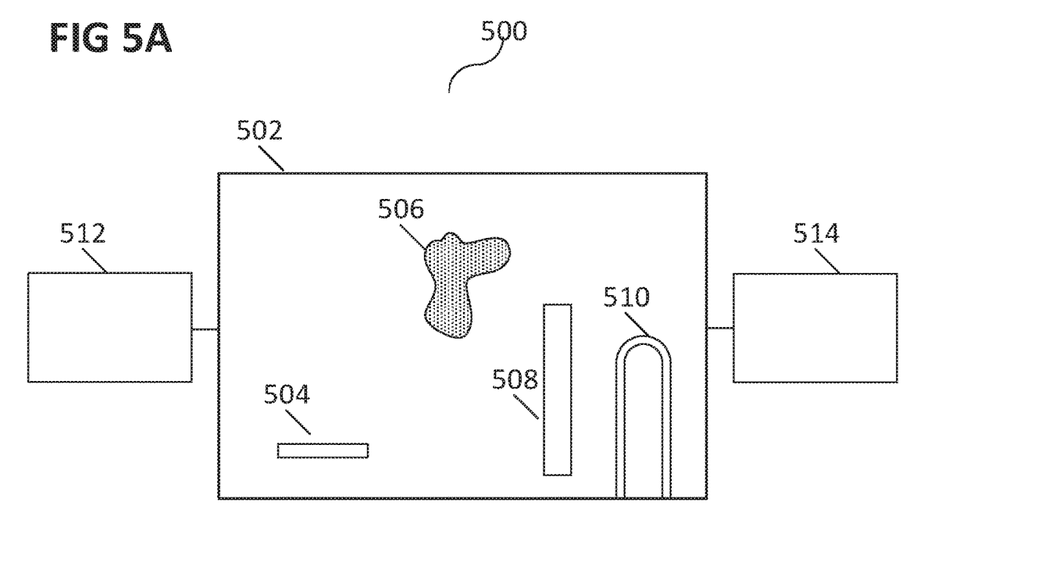
FIG. 5A and FIG. 5B respectively show a reactor for producing doped silicon feedstock material.
Figure 5B:
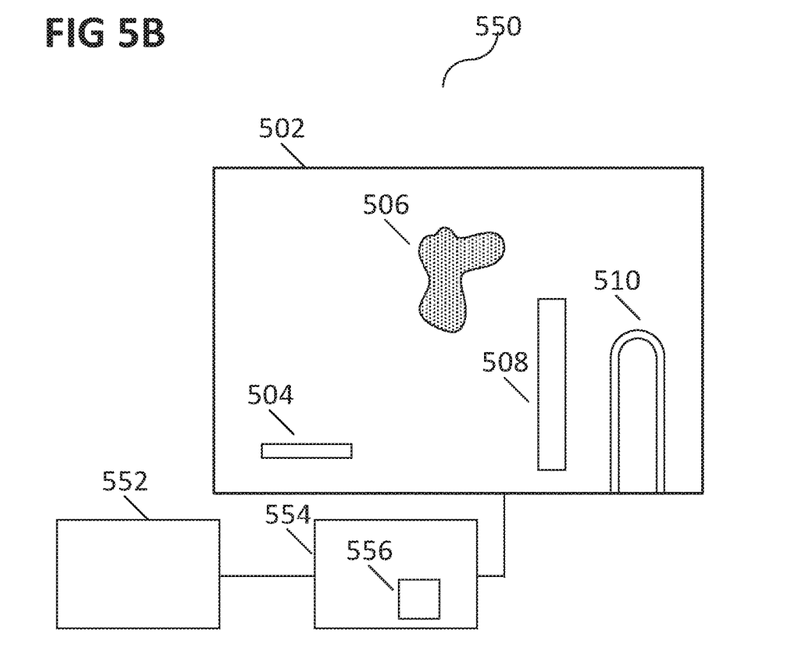
Figure 6:
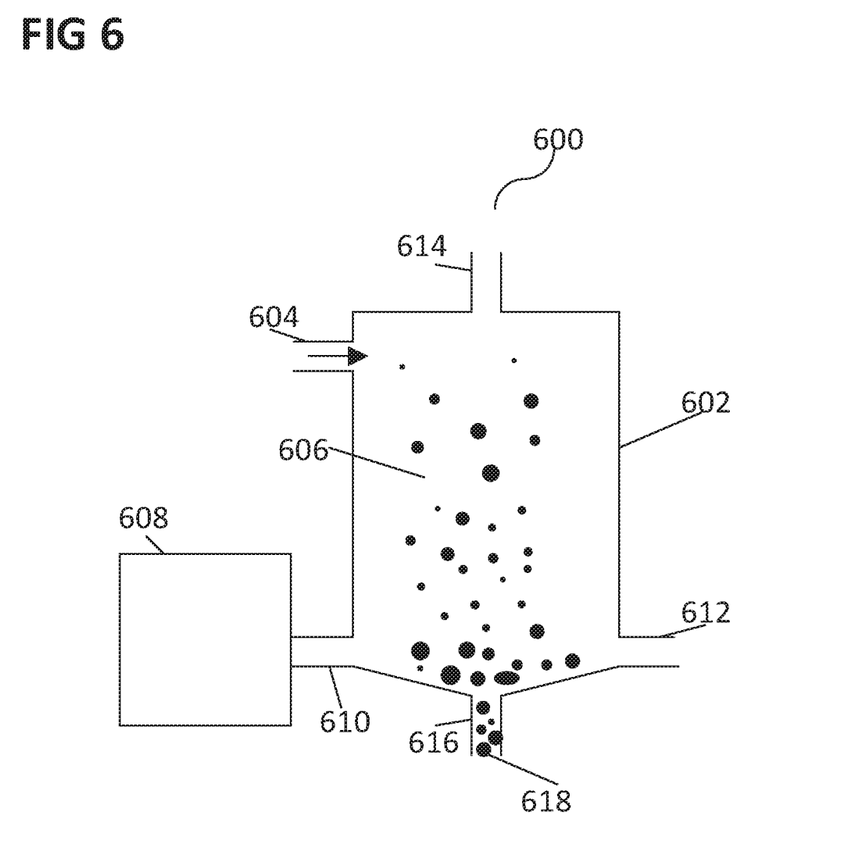
FIG. 6 shows another reactor for producing doped silicon feedstock material.

A reactor chamber may be part of a reactor, e.g. a reactor for a so-called Siemens process or a Fluidized bed reactor FBR. The reactor chamber may include necessary interfaces for introducing the first gas, a second gas and optionally other auxiliary gases. The reactor may include a controller, e.g. controlling a mass flow controller, pipes, vales, etc. to control the quantity, temperature, ratio of a gas mixture and time for introducing the first gas (and the second gas and optionally auxiliary gases) into the reactor chamber. The reactor may include a heater for heating the reactor chamber and/or heating components within the reactor chamber such as carriers/surfaces on which the silicon is deposited on. A heater/heating system may be controlled by the controller of the reactor. Further, the reactor may include a cooling system, e.g. to cool the sidewalls of the reactor chamber. In various examples, a reactor/reactor chamber may use electrical current/voltage to heat a component of the reactor/reactor chamber, e.g. the material and/or a surface of the material on which silicon is deposited on. For these cases that reactor/reactor chamber may include the necessary electrical contacts and a controller of the reactor may be configured to control the electrical current/voltage. Examples of reactors/reactor chambers are shown in FIG. 5A, FIG. 5B and FIG. 6.

In 104, the method 100 may include introducing a second gas including at least one of gallium or indium into the reactor chamber.

The second gas may include one or more components selected from a group consisting of: galliumtrichloride, trimethylgallium, triethylgallium, indiumtrimeythl, indiumtriethyl, and combinations thereof. Components of the second gas, such as organic parts or chlorine parts of the respective molecules, may be exhausted from the reactor chamber. Gallium and indium may be used to dope silicon for electrical hole- or p-conductance. The silicon may be doped with gallium or doped with indium. Furthermore, a combination of gallium and indium may be used. A reactor including the reactor chamber may include a controller which controls the quantity (e.g. rate/quantity per time) of the second gas to be introduced into the reactor chamber.

The second gas may be introduced into the reactor chamber at such a rate (e.g. controlled by the controller), that doped silicon is deposited onto a surface in the reactor chamber with a distribution of dopants in the deposited silicon; in a non-limiting embodiment, the distribution of dopants in the deposited silicon is a homogenous distribution. Further, an increasing or decreasing rate may be applied to implement an inhomogeneous distribution of dopants in the silicon.

In 106, the method 100 may include depositing silicon feedstock material doped with at least one of gallium or indium onto a surface within the reactor chamber. Depending on the components of the first gas and the second gas, a chemical reaction may occur which deposits silicon onto a surface within the reactor chamber. In the so-called Siemens process, the reaction may be formulated as $SiHCl_3 + H_2 \rightarrow Si + 3HCl$.

The hydrogen for the Siemens process may be included in the first gas, the second gas and/or the reactor/reactor chamber may have an interface for introducing a third gas, in this case hydrogen, into the reactor chamber. A third gas may be used as an auxiliary gas for a chemical reaction and/or for moderating the reaction, e.g. by controlling the atmosphere in the reactor chamber, for example by introducing a noble gas such as argon into the reactor chamber to control the reaction/process time. The third gas may also be a mixture of two or more gases.

The surface in the reactor chamber may be the surface of a carrier, e.g. the carrier may be a wafer, a block, a rod and/or a filament which may be attached to a holder, such as a chuck within the reactor chamber. One or more carriers may be within the reactor chamber. Furthermore, the surface may be the surface of particles. E.g. dust/powder such as silicon dust may be introduced into the reactor chamber (e.g. by another interface of the reactor chamber and at a rate controlled by the controller in a non-limiting embodiment) and the doped silicon is deposited on the particles/on the surface of the particles.

Silicon, especially silicon feedstock material for producing solar cells, may be doped by melting silicon in a crucible and adding a dopant and afterwards lowering the temperature of the melt to crystallize the (doped) silicon. Adding the right amount of dopants to the silicon melt to set the electrical conductance and other parameters (e.g. charge carrier lifetimes) for the crystallized silicon includes potential risks and a corresponding margin of error. Moreover, this includes the problem that the dopant may evaporate before it is solved in the melt. Another issue is related to the distribution of the dopant in the melt. To achieve a homogeneous distribution the melt has to be moved, e.g. stirred, or convection movements in the melts are used, which may take a lot of time for achieving a homogeneous distribution.

Preparing doped silicon, e.g. doped silicon feedstock material used as raw material to be melted, according to method 100 may address one or more of these issues. The deposited silicon feedstock material according to method 100 may already be homogeneously doped, which means that in a later melting no other dopant has to be added. The deposition allows adjusting (with a low margin of error) of the concentration of the dopant in the silicon. Also, when the silicon is melted, the dopant is already homogeneously distributed and no delay time for convection/diffusion of the dopant through the melt or stirring has to be applied. Gallium and indium do have a low segregation-coefficient relative to other dopants, such as boron. In a melt which is in the process of crystallization, this means that the dopants are less likely to be introduced into the solid crystallized phase and more likely to stay in the fluid phase of the melt. Therefore, when the whole melt crystallizes, an inhomogeneous distribution of the dopant in the solid silicon results.

In various non-limiting examples, a concentration of gallium in the deposited doped silicon feedstock material is more than $3 \times 10^{17}$ atoms/cm$^3$, e.g. in the range of $3 \times 10^{17}$ atoms/cm$^3$ to $2 \times 10^{18}$ atoms/cm$^3$. In various embodiments, also described in later examples, in the case that if silicon feedstock material is melted, e.g. in a crucible for example for a Czochralski crystallization process, to create monocrystalline and/or polycrystalline silicon, the silicon feedstock material may be doped by melting undoped silicon and doped silicon together. The dopant in the doped silicon feedstock material distributes in the melt and the total concentration of the dopant in the melt will be lower than in the doped silicon. Therefore, the doped silicon feedstock material has to have a correspondingly high doping concentration to achieve a certain doping in the melt and in the finished crystalline silicon afterwards. In the case of gallium as dopant, it is, e.g. due to the segregation coefficient of gallium in silicon, difficult to achieve such a high doping. By gallium doping via introducing gallium by a gaseous phase such a high doping can be achieved.

Figure 2:
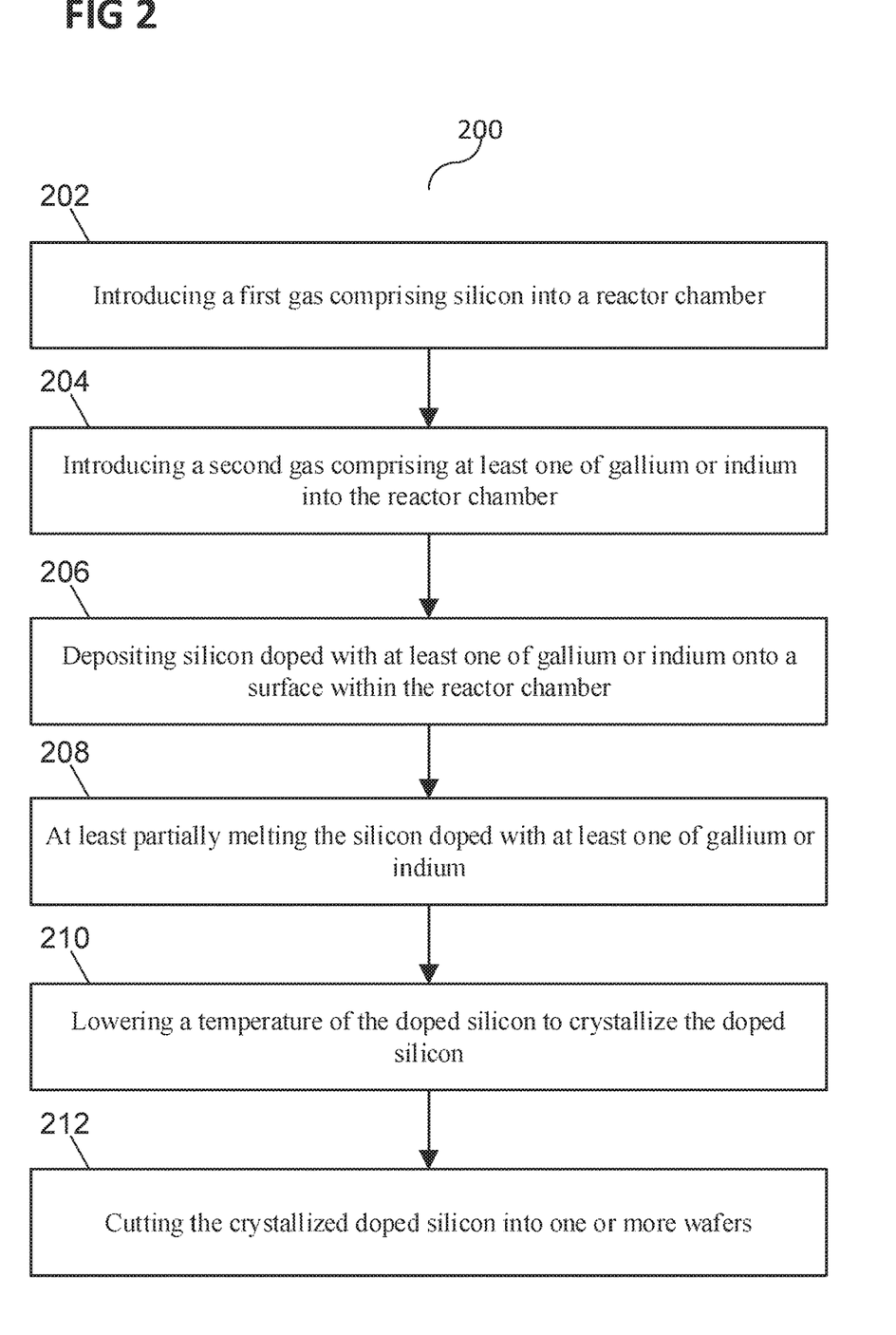
FIG. 2 shows a method for producing one or more silicon wafers.

FIG. 2 schematically shows a method 200 for producing one or more silicon wafers. Method 200 may be provided to obtain one or more silicon wafers.

The parts 202, 204 and 206 of method 200 may be the same as the parts 102, 104 and 106 of method 100. Method 200 may be understood as an extension of method 100.

At 202, a first gas including silicon may be introduced into a reactor chamber and at 204 a second gas including at least one of gallium or indium may be introduced into the reactor chamber. At 206, silicon feedstock material doped with at least one of gallium or indium is deposited onto a surface within the reactor chamber.

At 208, the silicon feedstock material doped with at least one of gallium or indium is at least partially melted. In an example, the doped silicon feedstock material is deposited onto a carrier and the deposited silicon feedstock material is melted together with the carrier, e.g. the carrier may include or essentially consist of silicon. In various examples, the deposited silicon feedstock material is removed from the carrier. In case the doped silicon feedstock material is deposited onto the surface of particles, the particles grow and these are melted. The deposited silicon feedstock material may be melted together with other materials, e.g. additional silicon feedstock material may be added. The carrier and/or additional silicon feedstock material may be doped or undoped, e.g. with the same dopant as the deposited silicon.

At 210, a temperature of the doped silicon is lowered to crystallize the doped silicon, e.g. to crystallize the doped silicon into a solid silicon ingot. Melting and crystallization may occur according to various known methods. By way of example, the doped silicon is melted in a crucible and crystallization is achieved by the Czochralski method or the Vertical Gradient Freeze method. The crystallized silicon may be subject to further treatment, e.g. the crystallized silicon may be subject to the Zone Melting method.

At 212, the crystallized doped silicon, e.g. a solid silicon ingot, may be cut into one or more wafers. By way of example, the crystallized silicon may be cut into ingots or other forms, and afterwards cut into wafers. Cutting may be achieved by known methods, such as (diamond) Wire Sawing. After cutting, one or more wafers may be subject to a chemical and/or mechanical cleaning process.

Figure 3:
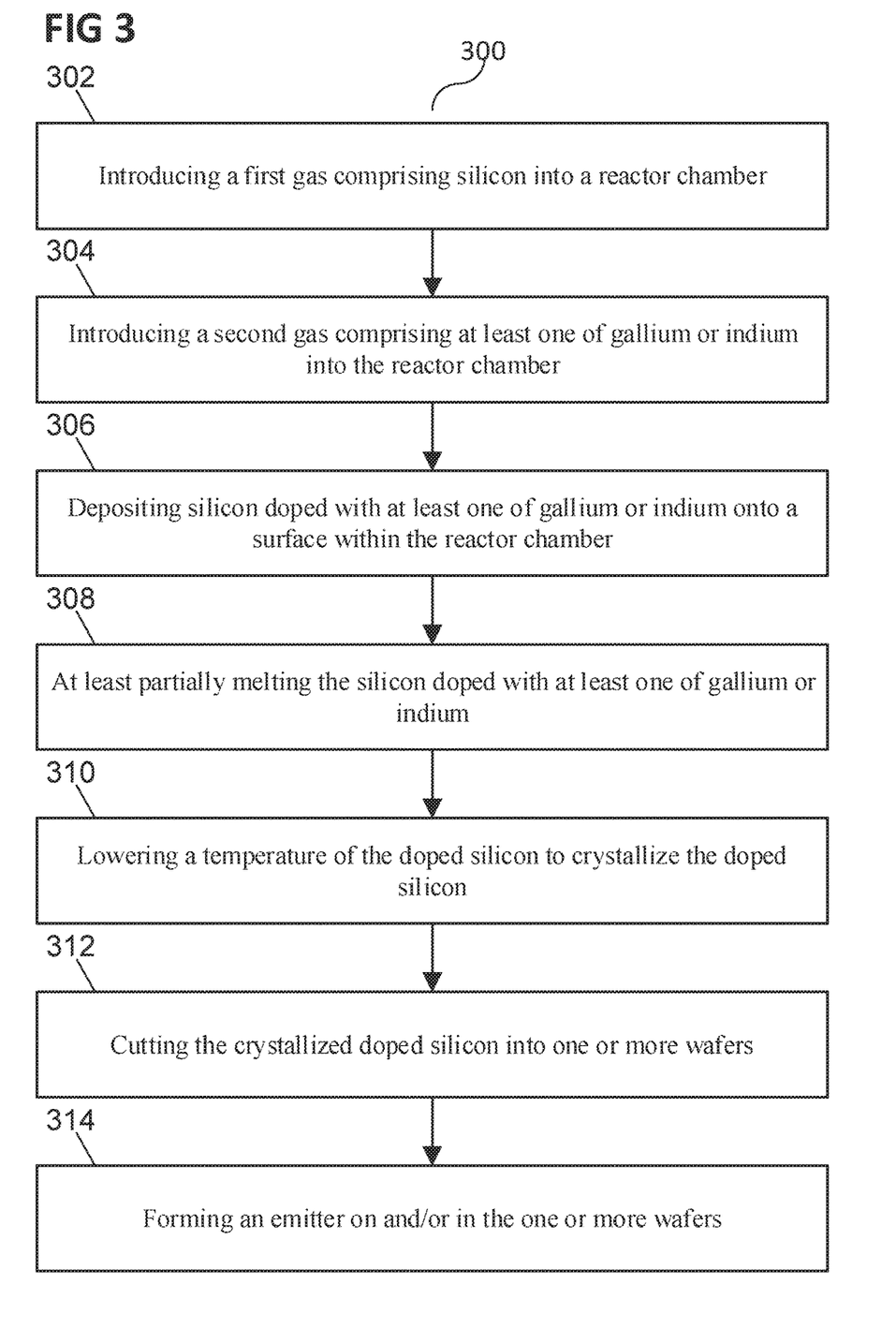
FIG. 3 shows a method for producing one or more solar cells.

FIG. 3 schematically shows a method 300 for producing one or more solar cells.

The parts 302, 304 and 306 of method 300 may be the same parts as the parts 202, 204 and 206 of method 200 and/or the parts 102, 104 and 106 of method 100. Method 300 may be understood as an extension of method 100 or method 200.

At 302, a first gas including silicon is introduced into a reactor chamber, and at 304, a second gas including at least one of gallium or indium is introduced into the reactor chamber, and at 306 silicon feedstock material doped with at least one of gallium or indium is deposited onto a surface within the reactor chamber. At 308, the silicon feedstock material doped with at least one of gallium or indium is at least partially melted, and at 310, a temperature of the doped silicon is lowered to crystallize the doped silicon, e.g. to crystallize the doped silicon into a solid silicon ingot. At 312, the crystallized doped silicon is cut into one or more wafers.

At 314, an emitter may be formed on and/or in the one or more wafers. The principle of a solar cell relies on separation of charge, e.g. implemented with a diode. Forming an emitter on and/or in the wafer may be understood as forming on and/or in the wafer an area with an opposing dopant. In the case of gallium and/or indium as p-dopants the emitter may be formed by n-dopants, such as phosphorus. N-doped silicon may be deposited onto the wafer and/or a n-dopant may be introduced into the wafer to create an area with a n-doping (or at least a net n-doping). By forming an emitter, a diode is created and in principle, a solar cell is generated. Several other methods may be subject to this solar cell such as coatings and applying electrical contacts.

Figure 4:
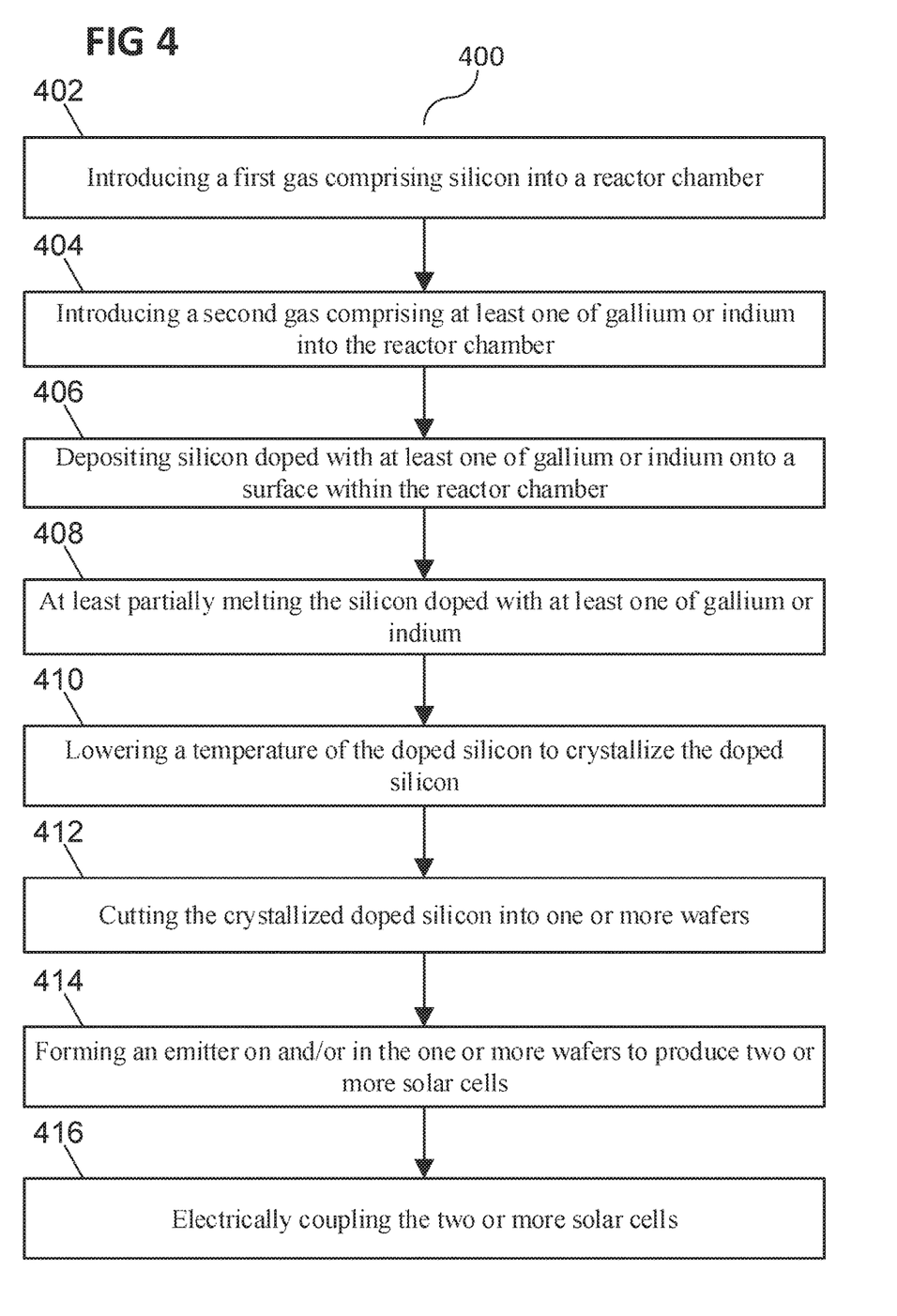
FIG. 4 shows a method for producing a PV module.

FIG. 4 schematically shows a method 400 for producing a PV module. Method 400 may be provided to obtain a PV module.

The parts 402, 404 and 406 may be the same parts as the parts 302, 304 and 306 of method 300, parts 202, 204 and 206 of method 200 and/or the parts 102, 104 and 106 of method 100. Method 400 may be understood as an extension of method 100, method 200 and/or method 300.

At 402, a first gas including silicon is introduced into a reactor chamber, and at 404 a second gas including at least one of gallium or indium is introduced into the reactor chamber, and at 406 silicon feedstock material doped with at least one of gallium or indium is deposited onto a surface within the reactor chamber. At 408, the silicon feedstock material doped with at least one of gallium or indium is at least partially melted, and at 410 a temperature of the doped silicon is lowered to crystallize the doped silicon, e.g. to crystallize the doped silicon into a solid silicon ingot. At 412, the crystallized doped silicon is cut into one or more wafers, and at 414 an emitter on and/or in the one or more wafers is formed to produce one or more solar cells.

At 416, the one or more solar cells are electrically contacted. E.g. two or more solar cells may also be electrically coupled together. In an example, electrical contacts are applied to the one or more solar cells, and two or more solar cells may be electrically coupled together by coupling the respective electrical contacts. Two or more solar cells may be coupled together using a serial or a parallel connection. By electrically contacting one or more solar cells, a photovoltaic (PV) module is created. Electrical contacts may be arranged on the PV module to couple the PV module to a load. The PV module may include a frame/enclosure to protect the two or more solar cells.

FIG. 5A schematically shows a reactor 500 for producing doped silicon feedstock material.

The reactor 500 may be used to at least partially implement the methods 100, 200, 300 and 400. Statements in the context of the methods 100, 200, 300 and 400 and statements in the context of the reactor 500 may respectively correspond.

The reactor 500 may include a reactor chamber 502. In the reactor chamber 502, different examples of surfaces 504, 506, 508 and 510 to deposit silicon feedstock material onto which may individually/separately or in a combination be present in the reactor chamber 502 are shown. The surface 504 may be the surface of a carrier, e.g. a carrier that is held by a holder (not shown). The carrier may have any geometrical form, e.g. a form adjusted to the geometry of the reactor, the gas flows in the reactor and/or adjusted to the intended form of the deposited silicon for a subsequent melting. The carrier may include or essentially consist of doped or undoped silicon. Additionally, or instead of the carrier, the surface may be the surface/surfaces 506 of particles, e.g. in a dust or a powder. As the carrier, the particles may include or essentially consist of doped or undoped silicon. The particles may be introduced into the reactor chamber 502 by another interface separate from the interface of the first gas and/or the second gas. The reactor chamber 502, e.g. controlled by a controller (not shown) of the reactor 500, may include a device to generate and/or stabilize the flow of the particles in the reactor chamber 502, e.g. a flow controller.

Additionally or instead of the carrier, a surface may be the surface 508 of a rod and/or the surface 510 of a filament. The rod, e.g. also a block, and the filament may have, correspondingly to the carrier, a form adjusted to the process and/or the geometrical form of the reactor 500 and may include or essentially consist of doped or undoped silicon.

The carrier, rod, and/or filament may be mechanically and electrically coupled to the reactor chamber 502, e.g. to an interface of the reactor chamber 502. An electrical current/voltage, e.g. controlled by a controller (not shown) of the reactor 500, may be applied to the carrier, rod, and/or filament to heat the respective materials to achieve an elevated temperature at the respective surfaces 504, 508 and 510. Further, heating may be performed by a heater (not shown) within the reactor chamber (502) or from one or more sidewalls of the reactor chamber 502. In various embodiments, if the surface includes the surface 506 of particles, a heater within or outside the reactor chamber 502 may be applied.

A first gas, e.g. according to the methods 100, 200, 300 and 400, may be stored in a first reservoir 512 and a second gas, e.g. according to the methods 100, 200, 300 and 400, may be stored in a second reservoir 514. The first gas and the second gas may be introduced into the reactor chamber 502 by piping and/or interfaces of the reactor chamber 502. The quantity and/or rate of the first gas and the second gas to be introduced into the reactor chamber 502 may be controlled by a controller of the reactor 500, e.g. the controller may use mass flow controllers.

In various examples, the first gas and/or the second gas may respectively be a mixture of different gases. In these examples, the reservoir 512 and/or the reservoir 514 may respectively be understood as mixing chambers in which the composition of the first gas and/or the second gas is achieved to be introduced into the reactor chamber 502.

In this and various other examples, the first gas and the second gas are separately introduced into the reactor chamber 502 using two interfaces of the reactor chamber 502. Depending on the chemical composition of the gases and possible chemical reactions between the first gas and the second gas (or at least of one or more components of the respective gases) separate interfaces may be useful to lower the risk of such a reaction within the supply system/supply pipes to the reactor chamber 502. In various embodiments, with separate interfaces, the quantity and rate of the first gas and the second gas to be introduced into the reactor chamber 502 may be controlled individually.

The reactor chamber 502 may also include another interface, e.g. a third interface to introduce additional gases such as auxiliary gases for a chemical reaction for the first gas and the second gas to deposit silicon. By way of example, hydrogen may be introduced into the reactor chamber 502 by a third interface, e.g. supplied by a third reservoir (not shown), and the rate and quantity of the additional gas to be introduced into the reactor chamber 502 may be also controlled by the controller of the reactor 500.

In various examples, the second gas is generated in the first reservoir 512 and/or the second reservoir 514. E.g. metallic gallium or gallium powder may be in the second reservoir 514 and a gas, such as HCl in a non-limiting embodiment, may be introduced into the second reservoir 514 to produce galliumtrichloride in a gaseous phase, e.g. by the chemical reaction $2Ga + 6HCl \rightarrow 2GaCl_3 + 3H_2$.

In various non-limiting examples, the first reservoir 512 and the second reservoir 514 may be heated by a respective heater, e.g. controlled by a controller of the reactor 500, to generate or to keep the gaseous phase of the first gas and the second gas or the respective components.

FIG. 5B schematically shows a reactor 550 for producing doped silicon feedstock material.

The reactor 550, as the reactor 500, may be provided to at least partially implement the methods 100, 200, 300 and 400. Statements in the context of the methods 100, 200, 300 and 400 and statements in the context of the reactor 500 may respectively correspond. The reactor 550 refers to another implementation of the reactor 500. Statements of components in the context of reactor 500 with the same reference sign also apply here.

A difference between the reactor 500 and the reactor 550 is that the first gas and the second gas are not introduced separately into the reactor chamber 502. In other words, the first gas and the second gas may be introduced with the same interface into the reactor chamber 502, i.e. at the same time. The first chamber 552 may be a reservoir of the first gas or the second gas or the first chamber 552 may be provided as a mixing chamber to generate the first gas or the second gas according to the composition necessary for the process in the reactor chamber 502. In various embodiments, the second chamber 554 may be a reservoir of the first gas or the second gas, or the second chamber 554 may be provided as a mixing chamber to generate the first gas or the second gas according to the composition necessary for the process in the reactor chamber 502.

The first gas or the second gas are introduced from the first chamber 552 to the second chamber 554 where it is mixed into the respective other gas and together as a mixture they may be introduced into the reactor chamber 502. By introducing the gases as a mixture into the reactor chamber 502, the reactor chamber 502 only needs one interface. In various embodiments, e.g. controlled by a controller of the reactor 550, the composition of the mixture of the first gas and the second gas may be controlled before entering the reactor chamber 502. Such a controller may also be configured to control the quantity/rate of the first gas and/or the second gas when introduced into the first chamber 552 and/or the second chamber 554.

In various examples, a material 556 is applied in the second chamber 554. The material 556 may be used to generate the second gas from the first gas. In various embodiments, the first gas may contain HCl, and the material 556 may be gallium, and by a chemical reaction as described in the context of FIG. 5A, galliumtrichloride may be produced. By controlling, e.g. by the controller of the reactor 500, the quantity/rate of the first gas to the material 556, the pressure and/or the temperature within the second reservoir 554, the chemical reaction to generate the second gas may be controlled. Thus, the composition of the mixture of the first gas and the second gas may be controlled. This may provide the effect that the second gas does not need to be stored in a container as a gaseous phase. Also, the second gas may need a certain temperature to stay in the gaseous phase, e.g. a temperature of more than 200° C., and this can be better controlled, if the second gas is generated directly in the process.

In various examples, the reactor 500 and the reactor 550 and the respective gases may be configured according to a Siemens process.

FIG. 6 schematically shows another reactor 600 for producing doped silicon feedstock material. The reactor 600 may be used to at least partially implement the methods 100, 200, 300 and 400. Statements in the context of the methods 100, 200, 300 and 400 may apply in the context of the reactor 600.

FIG. 6 schematically shows one example of a Fluidized Bed Reactor (FBR) 600. In various examples, other FBR reactors may be used. In the reactor chamber 602, particles 606, such as doped or undoped silicon, may be present. By the interface 610, a first gas and/or a second gas according to the methods 100, 200, 300 and/or 400, may be introduced into the reactor chamber 602. To keep the overview, in this example only chamber 608 as a reservoir for the first gas and/or the second gas and interface 610 are shown. In various examples, one or more interfaces and one or more chambers may be implemented in the reactor 600. By way of example, the reactor 600/reactor chamber 602 may include chambers/reservoirs and interfaces according to FIG. 5A and/or FIG. 5B to introduce the first gas, the second gas and optionally auxiliary gases/third gases to the reactor chamber 602, which may be implemented instead of chamber 608 and interface 610. Thus, statements and components described in the context of FIG. 5A and/or FIG. 5B may also apply for reactor 600.

Possible additional/auxiliary gases, such as hydrogen and/or a noble gas to control the pressure within the reactor chamber 602, may be introduced by an interface 612 into the reactor chamber 602. According to the principle of a FBR reactor, the first gas, the second gas, and possible additional/auxiliary gases flow between the particles 606; the gases may be supplied by the interface 604 to the reactor chamber 602. By flowing between the particles 606 the medium (particles 606 plus gases) in the reactor chamber behaves similar to a fluid. On the surface of the particles, doped silicon is deposited, and the particles 606 grow. Particles grown 618 to a certain degree, according to the process conditions, may be removed from the reactor chamber 602 by interface 616. Since the medium in the reactor chamber 602 behaves similar to a fluid, bigger particles/particles with doped silicon grown on them 618 are likely to sink to the bottom of the reactor chamber 602.

Figure 7A:
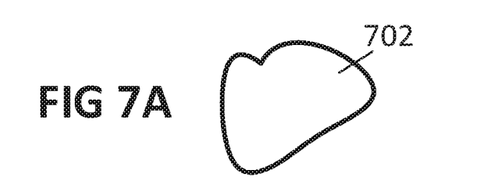
FIG. 7A shows doped silicon feedstock material.

FIG. 7A schematically shows doped silicon feedstock material 702. The doped silicon feedstock material 702 may be obtained by method 100 and may be generated in a reactor as described in the context of FIGS. 5A, 5B and 6.

Figure 7B:
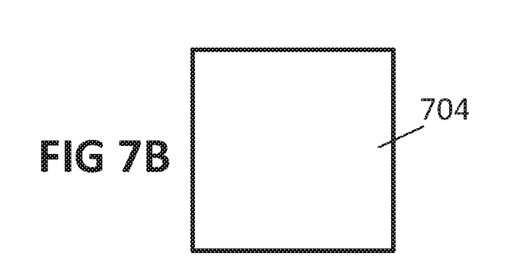
FIG. 7B shows a silicon wafer.

FIG. 7B schematically shows a silicon wafer 704. The silicon wafer 704 may be obtained by method 200 and the doped silicon feedstock material for the silicon wafer 704 may be obtained by method 100, e.g. and be generated in a reactor as described in the context of FIGS. 5A, 5B and 6.

Figure 7C:
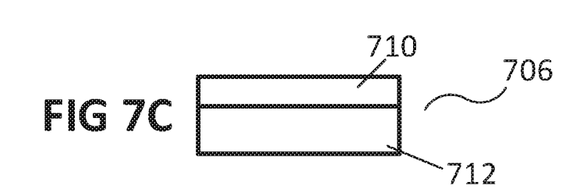
FIG. 7C shows a solar cell.

FIG. 7C schematically shows a solar cell 706. The solar cell 706 may be obtained by method 300 using a silicon wafer, which may be obtained by method 200 and the doped silicon feedstock material for the silicon wafer may be obtained by method 100, e.g. and be generated in a reactor as described in the context of FIG. 5A, FIG. 5B and FIG. 6. The solar cell 706 includes a body area 712 with a first doping, e.g. a p-doping, and an emitter area 710 with another doping, e.g. opposite doping such as n-doping.

Figure 7D:
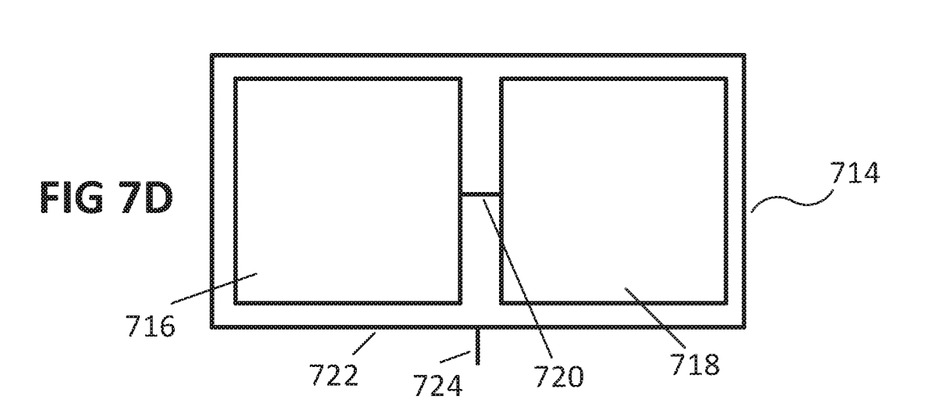
FIG. 7D shows a PV module.

FIG. 7D schematically shows a PV module 714. The PV module 714 may include a first solar cell 716 and a second solar cell 718. In other examples, a PV module may have a number of solar cells between 1 and 100, 1 and 50 and/or 1 and 32. The two solar cells 716 and 718 may be obtained by method 300 using a silicon wafer obtained by method 200, and the doped silicon feedstock material for the silicon wafer obtained by method 100, e.g. and generated in a reactor as described in the context of FIG. 5A, FIG. 5B and FIG. 6. The PV module 714 may have a frame and/or an enclosure 722 to protect the solar cells 716, 718. The two solar cells 716, 718 may be electrically coupled to each other by a coupling 720. The PV module 714 may include an electrical contact 724 coupled to the two solar cells 716, 718 to enable electrically coupling of the two solar cells 716,718 to a load outside of the PV module 714.

In the following, several examples and embodiments are described.

Example 1 is a method for depositing silicon feedstock material. The method may include introducing a first gas including silicon into a reactor chamber and introducing a second gas including at least one of gallium or indium into the reactor chamber and depositing silicon feedstock material doped with at least one of gallium or indium onto a surface within the reactor chamber.

Example 2, the subject-matter of example 1 may optionally include, that if the second gas includes gallium, than the second gas is introduced in such an amount that the concentration of gallium in the deposited doped silicon feedstock material is more than $3 \times 10^{17}$ atoms/cm$^3$.

Example 3, the subject-matter of example 1 and/or example 2 may optionally include that the second gas includes one or more components selected from a group consisting of: galliumtrichloride; trimethylgallium; triethylgallium; indiumtrimeythl; indiumtriethyl; and combinations thereof.

Example 4, the subject-matter of any one of examples 1 to 3 may optionally include that the second gas is heated to a temperature of more than 200° C. before introducing the second gas into the reactor chamber.

Example 5, the subject-matter of any one of examples 1 to 4 may optionally include that the first gas and the second gas are introduced into the reactor chamber as a mixture.

Example 6, the subject-matter of example 5 may optionally include that at least a portion of the first gas is exposed to a material to generate the second gas in a further reactor chamber before entering the reactor chamber.

Example 7, the subject-matter of any one of examples 1 to 4 may optionally include that the first gas and the second gas are introduced separately into the first reactor.

Example 8 is doped silicon feedstock material obtained by a method including introducing a first gas including silicon into a reactor chamber and introducing a second gas including at least one of gallium or indium into the reactor chamber and depositing silicon feedstock material doped with at least one of gallium or indium onto a surface within the reactor chamber.

Example 9, the subject-matter of example 8 may optionally include that if the second gas includes gallium, then the second gas is introduced in such an amount that the concentration of gallium in the deposited doped silicon feedstock material is more than $3 \times 10^{17}$ atoms/cm$^3$.

Example 10, the subject-matter of example 8 and/or example 9 may optionally include that the second gas includes one or more components from a group consisting of: galliumtrichloride; trimethylgallium; triethylgallium; indiumtrimeythl; indiumtriethyl; and combinations thereof.

Example 11, the subject-matter of any one of examples 8 to 10 may optionally include that the second gas has a temperature of more than 200° C. before introducing the second gas into the reactor chamber.

Example 12, the subject-matter of any one of examples 8 to 11 may optionally include that the first gas and the second gas are introduced into the reactor chamber as a mixture.

Example 13, the subject-matter of example 12 may optionally include that at least a portion of the first gas is exposed to a material to generate the second gas in a further reactor chamber before entering the reactor chamber.

Example 14, the subject-matter of any one of examples 8 to 11 may optionally include that the first gas and the second gas are introduced separately into the first reactor.

Example 15 is a silicon wafer obtained by a method. The method may include producing silicon feedstock material doped with at least one of gallium or indium by introducing a first gas including silicon into a reactor chamber and introducing a second gas including at least one of gallium or indium into the reactor chamber and depositing silicon feedstock material doped with at least one of gallium or indium onto a surface within the reactor chamber. The method may further include at least partially melting the silicon feedstock material doped with at least one of gallium or indium and lowering a temperature of the doped silicon to crystallize the doped silicon into a solid silicon ingot and cutting the solid silicon ingot into one or more wafers.

Example 16, the subject-matter of example 15 may optionally include that the doped silicon feedstock material is crystallized according to a Vertical Gradient Freeze method or a Czochralski method.

Example 17, the subject-matter of example 15 or example 16 may optionally include that the doped silicon feedstock material may be produced by a method according to any one of examples 1 to 7.

Example 18, the subject-matter of example 15 or example 16 may optionally include that the doped silicon feedstock material may be obtained according to any one of examples 8 to 14.

Example 19 is a solar cell obtained by a method. The method including introducing a first gas including silicon into a reactor chamber and introducing a second gas including at least one of gallium or indium into the reactor chamber and depositing silicon feedstock material doped with at least one of gallium or indium onto a surface within the reactor chamber. The method may further include at least partially melting the silicon feedstock material doped with at least one of gallium or indium and lowering a temperature of the doped silicon to crystallize the doped silicon into a solid silicon ingot. Furthermore, the method may include cutting the solid silicon ingot into one or more wafers and forming an emitter on and/or in the one or more wafers.

Example 20, the subject-matter of example 16 may optionally include that the doped silicon feedstock material is crystallized according to a Vertical Gradient Freeze method or a Czochralski method.

Example 21, the subject-matter of example 20 or example 21 may optionally include that the doped silicon feedstock material may be produced by a method according to any one of examples 1 to 7.

Example 22, the subject-matter of example 20 or example 21 may optionally include that the doped silicon feedstock material may be obtained according to any one of examples 8 to 14.

Example 23 is a PV module obtained by a method including introducing a first gas including silicon into a reactor chamber and introducing a second gas including at least one of gallium or indium into the reactor chamber and depositing silicon feedstock material doped with at least one of gallium or indium onto a surface within the reactor chamber. The method may further include at least partially melting the silicon feedstock material doped with at least one of gallium or indium and lowering a temperature of the doped silicon to crystallize the doped silicon into a solid silicon ingot. Furthermore, the method may include cutting the solid silicon ingot into one or more wafers and forming an emitter on and/or in the one or more wafers to produce one or more solar cells and electrically contacting the one or more solar cells.

Example 24, the subject-matter of example 23 may optionally include that the doped silicon feedstock material is crystallized according to a Vertical Gradient Freeze method or a Czochralski method.

Example 25, the subject-matter of example 23 or example 24 may optionally include that the doped silicon feedstock material may be produced by a method according to any one of examples 1 to 7.

Example 26, the subject-matter of example 23 or example 24 may optionally include that the doped silicon feedstock material may be obtained according to any one of examples 8 to 14.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for depositing a doped silicon feedstock material, the method comprising:
   introducing a first gas comprising silicon into a reactor chamber; and
   introducing a second gas comprising at least one of gallium or indium into the reactor chamber; and
   depositing silicon feedstock material doped with at least one of gallium or indium onto a surface within the reactor chamber,
   wherein the first gas and the second gas are introduced into the reactor chamber as a mixture, wherein at least a portion of the first gas is exposed to a material to generate the second gas in a further reactor chamber before entering the reactor chamber,
wherein the further reactor chamber is located outside the reactor chamber.

2. The method of claim 1,
wherein the second gas comprises gallium;
wherein the second gas is introduced in such an amount that a concentration of gallium in the deposited doped silicon feedstock material is more than $3 \times 10^{17}$ atoms/cm$^3$.

3. The method of claim 1,
wherein the second gas comprises one or more components selected from a group consisting of: galliumtrichloride; trimethylgallium; triethylgallium; indiumtrimeythl; indiumtriethyl; and combinations thereof.

4. The method of claim 1,
wherein the second gas is heated to a temperature of more than 200° C. before introducing the second gas into the reactor chamber.

5. A doped silicon feedstock material obtained by a method comprising:
introducing a first gas comprising silicon into a reactor chamber;
introducing a second gas comprising at least one of gallium or indium into the reactor chamber; and
depositing silicon feedstock material doped with at least one of gallium or indium onto a surface within the reactor chamber,
wherein the first gas and the second gas are introduced into the reactor chamber as a mixture,
wherein at least a portion of the first gas is exposed to a material to generate the second gas in a further reactor chamber before entering the reactor chamber,
wherein the further reactor chamber is located outside the reactor chamber.

6. The doped silicon feedstock material of claim 5,
wherein the second gas comprises gallium;
wherein the second gas is introduced in such an amount that a concentration of gallium in the deposited doped silicon feedstock material is more than $3 \times 10^{17}$ atoms/cm$^3$.

7. The doped silicon feedstock material of claim 5,
wherein the second gas comprises one or more components from a group consisting of: galliumtrichloride; trimethylgallium; triethylgallium; indiumtrimeythl; indiumtriethyl; and combinations thereof.

8. The doped silicon feedstock material of claim 5,
wherein the second gas has a temperature of more than 200° C. before introducing the second gas into the reactor chamber.

9. A method to produce a silicon wafer, the method comprising:
producing silicon feedstock material doped with at least one of gallium or indium according to a method, comprising:
introducing a first gas comprising silicon into a reactor chamber; and
introducing a second gas comprising at least one of gallium or indium into the reactor chamber; and
depositing the silicon feedstock material doped with at least one of gallium or indium onto a surface within the reactor chamber,
wherein the first gas and the second gas are introduced into the reactor chamber as a mixture,
wherein at least a portion of the first gas is exposed to a material to generate the second gas in a further reactor chamber before entering the reactor chamber,
wherein the further reactor chamber is located outside the reactor chamber;
at least partially melting the silicon feedstock material doped with at least one of gallium or indium;
lowering a temperature of the melted silicon feedstock material doped with at least one of gallium or indium to crystallize the melted silicon feedstock material doped with at least one gallium or indium into a solid silicon ingot; and
cutting the solid silicon ingot into one or more wafers.

10. The method of claim 9,
wherein the melted silicon feedstock material doped with at least one of gallium or indium is crystallized according to a Vertical Gradient Freeze method or a Czochralski method.

11. A method to produce a solar cell, the method comprising:
producing silicon feedstock material doped with at least one of gallium or indium according to a method, comprising:
introducing a first gas comprising silicon into a reactor chamber; and
introducing a second gas comprising at least one of gallium or indium into the reactor chamber; and
depositing the silicon feedstock material doped with at least one of gallium or indium onto a surface within the reactor chamber,
wherein the first gas and the second gas are introduced into the reactor chamber as a mixture,
wherein at least a portion of the first gas is exposed to a material to generate the second gas in a further reactor chamber before entering the reactor chamber,
wherein the further reactor chamber is located outside the reactor chamber;
at least partially melting the silicon feedstock material doped with at least one of gallium or indium;
lowering a temperature of the melted silicon feedstock material doped with at least one of gallium or indium to crystallize the melted silicon feedstock material doped with at least one of gallium or indium into a solid silicon ingot;
cutting the solid silicon ingot into one or more wafers; and
forming an emitter on or in the one or more wafers.

12. The method of claim 11,
wherein the melted silicon feedstock material doped with at least one of gallium or indium is crystallized according to a Vertical Gradient Freeze method or a Czochralski method.

13. A method to produce a photovoltaic module, the method comprising:
producing silicon feedstock material doped with at least one of gallium or indium according to a method, comprising:
introducing a first gas comprising silicon into a reactor chamber; and
introducing a second gas comprising at least one of gallium or indium into the reactor chamber; and
depositing the silicon feedstock material doped with at least one of gallium or indium onto a surface within the reactor chamber,
wherein the first gas and the second gas are introduced into the reactor chamber as a mixture, wherein at least a portion of the first gas is exposed to a material to generate the second gas in a further reactor chamber before entering the reactor chamber, wherein the further reactor chamber is located outside the reactor chamber;

at least partially melting the silicon feedstock material doped with at least one of gallium or indium;

lowering a temperature of the melted silicon feedstock material doped with at least one of gallium or indium to crystallize the melted silicon feedstock material doped with at least one of gallium or indium into a solid silicon ingot;

cutting the solid silicon ingot into one or more wafers;

forming an emitter on or in the one or more wafers to produce one or more solar cells; and electrically contacting the one or more solar cells.

14. The method of claim 13, wherein the melted silicon feedstock material doped with at least one of gallium or indium is crystallized according to a Vertical Gradient Freeze method or a Czochralski method.

* * * * *

UNITED STATES PATENT AND TRADEMARK OFFICE
CERTIFICATE OF CORRECTION

PATENT NO. : 10,392,725 B2  
APPLICATION NO. : 15/708227  
DATED : August 27, 2019  
INVENTOR(S) : Frank Asbeck Page 1 of 1

It is certified that error appears in the above-identified patent and that said Letters Patent is hereby corrected as shown below:

In the Specification

Column 6, Line 31: please change "phosphorus" to --phosphorous--

In the Claims

Column 14, Line 11, Claim 9: please insert -- of -- between one and gallium.

Signed and Sealed this  
Third Day of December, 2019

Andrei Iancu  
*Director of the United States Patent and Trademark Office*